(12) United States Patent
Klonowski et al.

(10) Patent No.: US 10,807,724 B2
(45) Date of Patent: Oct. 20, 2020

(54) AIRCRAFT TURBOPROP ENGINE PROVIDED WITH AN ELECTRIC MACHINE

(71) Applicant: SAFRAN HELICOPTER ENGINES, Bordes (FR)

(72) Inventors: Thomas Klonowski, Moissy-Cramayel (FR); Olivier Lafargue, Moissy-Cramayel (FR); Antoine Moutaux, Moissy-Cramayel (FR); Jean-Julien Camille Vonfelt, Moissy-Cramayel (FR); Bertrand Nogarede, Coursan (FR)

(73) Assignee: SAFRAN HELICOPTER ENGINES, Bordes (FR)

( * ) Notice: Subject to any disclaimer, the term of this patent is extended or adjusted under 35 U.S.C. 154(b) by 43 days.

(21) Appl. No.: 16/337,998

(22) PCT Filed: Oct. 2, 2017

(86) PCT No.: PCT/FR2017/052692
§ 371 (c)(1),
(2) Date: Mar. 29, 2019

(87) PCT Pub. No.: WO2018/065709
PCT Pub. Date: Apr. 12, 2018

(65) Prior Publication Data
US 2019/0233128 A1    Aug. 1, 2019

(30) Foreign Application Priority Data

Oct. 3, 2016    (FR) ..................................... 16 59513

(51) Int. Cl.
*B64D 15/12* (2006.01)
*H02K 16/02* (2006.01)
(Continued)

(52) U.S. Cl.
CPC ............. *B64D 15/12* (2013.01); *B64D 27/24* (2013.01); *H01L 35/32* (2013.01); *H02K 7/1823* (2013.01);
(Continued)

(58) Field of Classification Search
CPC .. B64D 15/12; B64D 2027/026; H02K 16/02; H02K 21/48; H02K 7/20
See application file for complete search history.

(56) References Cited

U.S. PATENT DOCUMENTS 2,488,392 A * 11/1949 Archibald ............ H02K 7/1861
416/146 R
3,657,514 A * 4/1972 Adams ................... B64D 15/14
219/201
(Continued)

FOREIGN PATENT DOCUMENTS

EP    0642209 A1    3/1995
EP    1096648 A2    5/2001
(Continued)

OTHER PUBLICATIONS

International Search Report issued in Application No. PCT/FR2017/052692 dated Feb. 7, 2018.
(Continued)

*Primary Examiner* — Moshe Wilensky
*Assistant Examiner* — Brian Christopher Delrue
(74) *Attorney, Agent, or Firm* — Pearne & Gordon LLP

(57) ABSTRACT

The electrical machine according to the invention is a dual machine, and comprises a first machine which can be reversed and a second machine functioning through induction between two windings. The second machine can be used for de-icing a propeller, the induction-receiving winding being mounted on the propeller shaft. The first electrical machine can function as an electrical engine to 'taxi' the (Continued)

Figure 1:
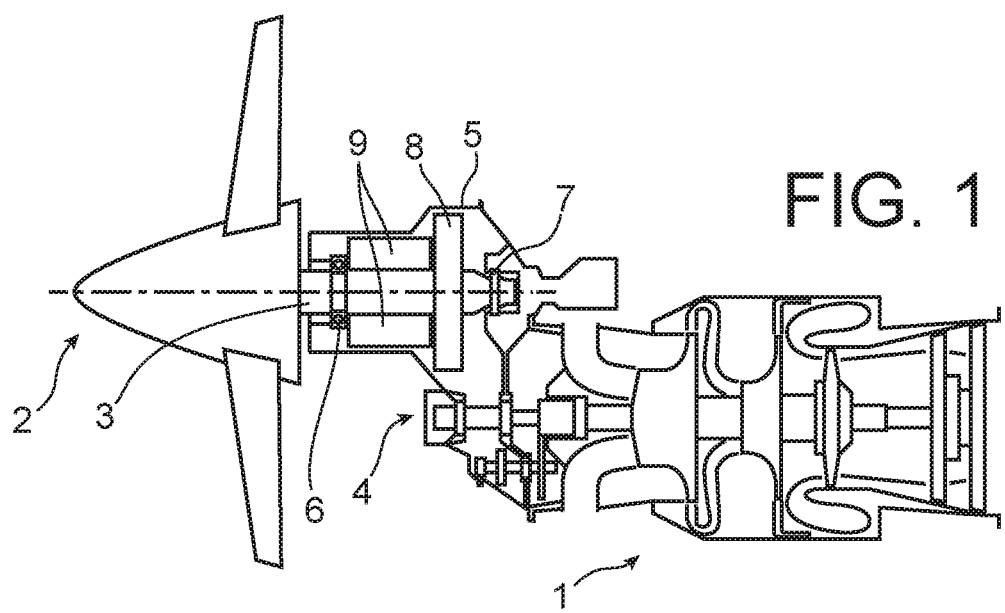

aircraft. In certain embodiments, the winding mounted on the stator is common to the two machines and different magnetic flows are utilised to control them. A separate functioning of the two machines and a very good integration into the aircraft engine, with space-saving and low mass, are possible.

9 Claims, 2 Drawing Sheets

(51) Int. Cl.
  H02K 21/48 (2006.01)
  B64D 27/24 (2006.01)
  H01L 35/32 (2006.01)
  H02K 7/18 (2006.01)
  H02K 7/20 (2006.01)
  B64D 27/02 (2006.01)
  F04D 25/06 (2006.01)
(52) U.S. Cl.
  CPC ............ *H02K 7/20* (2013.01); *H02K 16/02* (2013.01); *H02K 21/48* (2013.01); *B64D 2027/026* (2013.01); *F04D 25/06* (2013.01)

(56) References Cited

U.S. PATENT DOCUMENTS

| | | | |
|---|---|---|---|
| 8,232,700 B2 * | 7/2012 | Dooley | H02K 16/02 310/114 |
| 10,378,452 B1 * | 8/2019 | Barmichev | F01D 15/10 |
| 2010/0038473 A1 * | 2/2010 | Schneider | B64D 35/00 244/60 |
| 2014/0013751 A1 * | 1/2014 | Roggemans | B64D 27/24 60/705 |
| 2014/0117148 A1 * | 5/2014 | Dyrla | B64D 31/00 244/17.13 |
| 2017/0320584 A1 * | 11/2017 | Menheere | F02C 7/32 |
| 2017/0321601 A1 | 11/2017 | Lafargue et al. | |
| 2019/0322382 A1 * | 10/2019 | Mackin | B64D 27/24 |
| 2019/0323426 A1 * | 10/2019 | Mackin | F02C 9/20 |
| 2019/0323427 A1 * | 10/2019 | Mackin | F02C 3/04 |
| 2019/0393763 A1 * | 12/2019 | Menheere | F04D 25/045 |
| 2020/0031478 A1 * | 1/2020 | Clark | H02K 1/22 |
| 2020/0031481 A1 * | 1/2020 | Gazzino | B64D 27/24 |
| 2020/0047896 A1 * | 2/2020 | Dierksmeier | B64D 27/02 |
| 2020/0072130 A1 * | 3/2020 | Smith | F01D 21/003 |
| 2020/0083823 A1 * | 3/2020 | Latulipe | B60L 50/13 |
| 2020/0115062 A1 * | 4/2020 | Klonowski | B64C 27/08 |
| 2020/0148373 A1 * | 5/2020 | Long | F01D 15/10 |
| 2020/0153252 A1 * | 5/2020 | Long | B64D 27/02 |

FOREIGN PATENT DOCUMENTS

| | | | | |
|---|---|---|---|---|
| EP | 2404775 | A2 | 1/2012 | |
| EP | 2456056 | A2 | 5/2012 | |
| EP | 2688184 | A1 | 1/2014 | |
| EP | 3007336 | A1 | 4/2016 | |
| GB | 584563 | A * | 1/1947 | ............ B64D 15/12 |
| GB | 584563 | A | 1/1947 | |
| GB | 2184609 | A | 6/1987 | |
| GB | 2264812 | A * | 9/1993 | ............ H02K 21/48 |
| GB | 2264812 | A | 9/1993 | |

OTHER PUBLICATIONS

Application document as-filed for patent application entitled: Hybrid Propulsion System for Multi-Rotor Rotary Wing Aircraft, Comprising Improved DC/AC Conversion Means, U.S. Appl. No. 16/336,537, filed Mar. 26, 2019.

* cited by examiner

AIRCRAFT TURBOPROP ENGINE PROVIDED WITH AN ELECTRIC MACHINE

This is the National Stage application of PCT international application PCT/FR2017/052692, filed on Oct. 2, 2017 entitled "AIRCRAFT TURBOPROP EQUIPPED WITH AN ELECTRICAL MACHINE", which claims the priority of French Patent Application No. 16 59513 filed Oct. 3, 2016, both of which are incorporated herein by reference in their entirety.

The subject of the invention is an aircraft turboprop engine provided with an electric machine.

Turboprop engines comprise a propeller, a propeller-carrying shaft and a gas turbine which is generally connected to the propeller-carrying shaft in order to drive the latter. During a standard flight, the aircraft reproduces five phases: driving on the ground before take-off or taxiing, take-off, flight, landing then again taxiing. During the flight, the aircraft moves propelled by the propeller, itself driven in rotation by the gas turbine. There are, however, other modes of driving the propeller, including that which is carried out when the gas turbine is inactive and in particular during the taxiing. This mode of moving with the turbine turned off is appreciated because it involves significant fuel economy. An electric motor is then used to move the aircraft. The aircraft also requires a constant provision of electricity in order to ensure various services, which include the de-icing of the propeller, which can be carried out independently of the operation of the electric motor. The prior art comprises (GB 584 563 A) turboprop engines provided with electric machines disposed around the propeller-carrying shaft either in order to carry out the de-icing, or in order to operate or modify the angle of attack of the blades of the propeller as reversible electricity generators, thus capable of driving the propeller-carrying shaft when necessary. A widespread structure (U.S. Pat. No. 2,488,392 A) comprises two electric machines following one another along the propeller-carrying shaft and which can thus independently ensure these two functions, but it is observed that the arranged is very complicated and involves a significant increase in mass and footprint. And the known de-icing devices, based on the use of collectors with brushes in order to transmit a generally continuous current to a device that is rotating since it is incorporated into the propeller and into the propeller-carrying shaft, are themselves complex, and subject to wear.

The fundamental object of the invention is to provide an electric machine that is easily integrated into the structure of a turboprop engine and which is capable of carrying out a plurality of functions of providing energy including the de-icing of a propeller, with a reduced footprint and mass.

The invention relates to a turboprop engine provided with an electric machine that meets this requirement, and more precisely a turboprop engine, comprising a propeller, a propeller-carrying shaft and an electric machine around the propeller-carrying shaft, characterised in that the electric machine comprises a first machine formed on a stator and a first rotor, and a second machine formed on the stator and a second rotor corresponding to the propeller-carrying shaft, the stator, the first rotor and the second rotor being concentric, the first machine and the second machine being controlled by different electric circuits, the first machine being reversible and the second electric machine belonging to a circuit for de-icing of the propeller, the second rotor carrying an induced winding, and the first rotor is connected to the second rotor by a mechanical transmission.

Two electric machines are thus obtained, the operation of which is independent, but which are integrated one into the other in a compact arrangement with a simple structure, and which is suitable for occupying a reduced volume and mass in a turboprop engine and an aircraft: in particular with a reduced axial footprint and very little mechanical-link equipment between the elements of the machine and the other portions of the turboprop engine. The electrical connections also do not need to be complicated.

A good integration of the machine of the invention into its turboprop-engine environment is achieved. The two machines operate independently, and regardless of the state—rotating or at rest—of the propeller-carrying shaft.

Another aspect of the invention is an aircraft equipped with such a turboprop engine.

Figure 2:
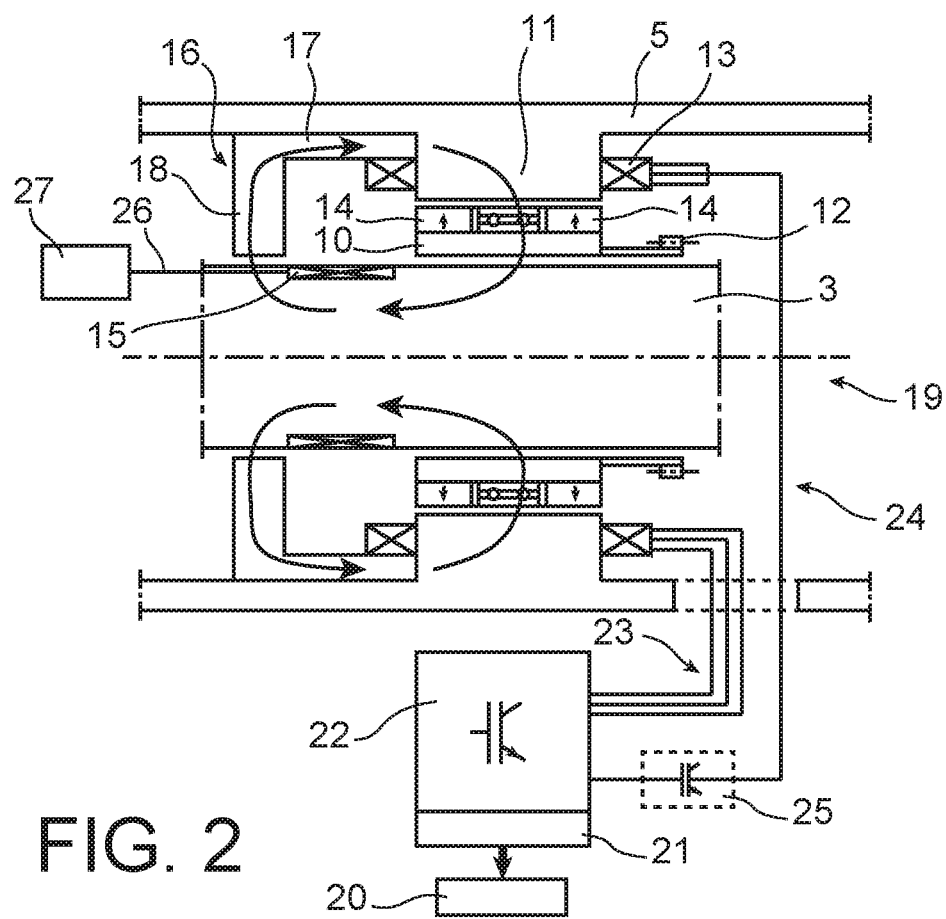
Figure 3:
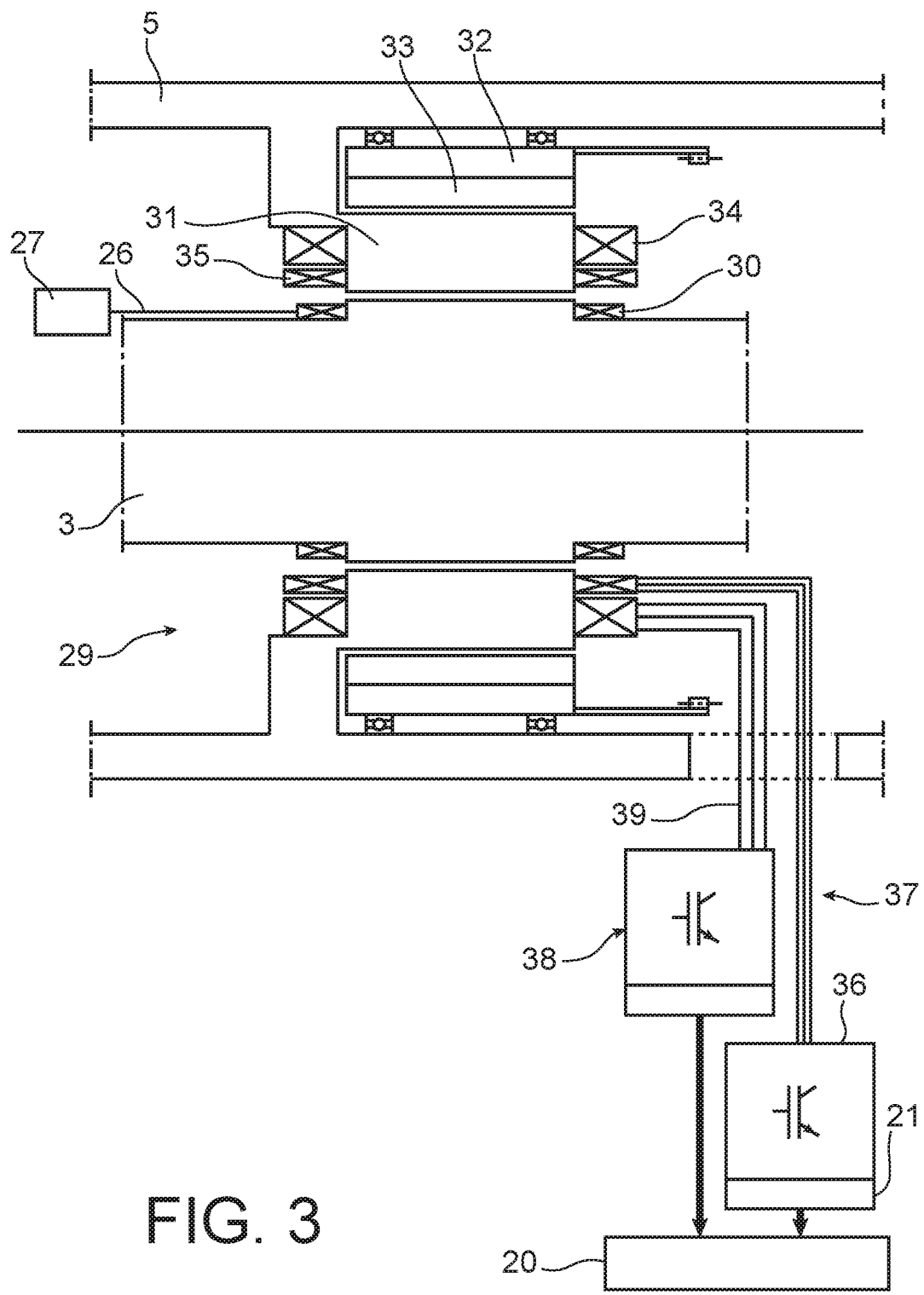

The various aspects, features and advantages of the invention will now be described by means of the following drawings:

FIG. 1 schematically illustrates a turboprop engine equipped with the invention;

FIG. 2 illustrates a realisation of the electric machine;

and FIG. 3, another realisation of the electric machine.

FIG. 1 shows the turboprop engine of the invention, comprising a gas turbine 1, a propeller 2, a propeller-carrying shaft 3, extending towards the gas turbine 1 and capable of being connected to a turbine shaft 4, which is parallel to it and extends at a short distance from it, by a known transmission that is not shown. The propeller-carrying shaft 3 is surrounded by a protective casing 5. It is supported in the casing 5 by rolling bearings 6 and 7. One of the rolling bearings 6 is close to the propeller 2, and the other of the rolling bearings 7 is adjacent to a toothed wheel 8 for driving the propeller-carrying shaft 3, which meshes with the transmission mentioned above. An electric machine 9, characteristic of the invention, is disposed around the propeller-carrying shaft 3, between the first rolling bearing 6 and the toothed wheel 8, while being surrounded by the casing 5 The aircraft of the invention is not otherwise modified and is not therefore shown in its entirety.

Let us move on to FIG. 2, which describes the electric machine 9.

In this embodiment, the propeller-carrying shaft 3 is surrounded by a concentric rotor 10, itself surrounded by a stator ring 11 belonging to the casing 5. The stator ring 11 is provided with a main winding 13 which can be three-phase but more generally multi-phase. The rotor 10 is provided with a ring of magnetic poles 14. Finally, the propeller-carrying shaft 3 is provided with a receiver winding 15 axially slightly offset from the rotor 10 and from the stator ring 11. Other equipment that can be seen in this FIG. 2 includes gear teeth 12 disposed at the end of the inner rotor 10 and which are connected to a mechanical transmission in order to transmit a mechanical energy to the rotor 10 or on the contrary collect this energy according to the operating mode of the machine; a magnetic bridge 16, comprising a portion 17 connected to the stator 11 and extending axially and cylindrically, and a portion 18 extending radially and extending from the former to an end near the propeller-carrying shaft 3, either in front of the receiver winding 15, or side by side, in such a way that the receiver winding 15 thus extends between this portion 18 and the rotor 10; and an electric device 19 connecting the main winding 13 to a continuous bus 20 and comprising in particular, starting from the latter, filters 21, a main converter 22, a main circuit 23 composed of at least three wires leading to the phases of the main winding 13 and an auxiliary circuit 24, provided with an auxiliary converter 25, and leading to the neutral of the main winding 13.

Here is how the device operates. The main winding 13 and the rotor 10 provided with the ring of magnetic poles 14 form a first electric machine capable, according to the requirements of the moment, of providing electric energy to the aircraft, or on the contrary mechanical energy allowing to move it, while the gas turbine 1 is stopped. The transmission by which the mechanical energy of the rotor 10 is used can consist of a train of planetary gears 40 connecting the gear teeth 12 to gear teeth 41 of the propeller-carrying shaft 3, in order to make the latter rotate, via planets 42, the axis of which is rigidly connected to the stator (connected to the casing 5). Transmissions of this type thus allow reversible transmissions of power between the rotor 10 and the propeller-carrying shaft 3.

The receiver winding 15 is an induced winding which, associated with the main winding 13, forms a second electric machine, operating only as a generator and which is provided in order to be assigned to the de-icing of the blades of the propeller 2: an electric circuit 26, rigidly connected to the propeller-carrying shaft 3, connects for this purpose the receiver winding 15 to a thermoelectric heating device 27 contained in the propeller 2; it can be very simple and be composed in particular of conductive wires. In general, the invention allows to not use electrical connectors rotating with friction, the windings linked to the stator are dependent on control equipment rigidly connected to the stator, and the winding linked to the propeller-carrying shaft serving a piece of equipment disposed on this shaft, or on the propeller which is linked to it.

It is observed that the combined electric machine is easily integrated into the turboprop engine, by occupying in practice a cavity of the casing 5 that was empty before, and that its arrangement uses a reduced number of parts and requires few modifications of the existing structure, and thus the mass and the footprint are reduced. The need to transmit the electricity from a fixed generator to the propeller-carrying shaft 2 by a collector with brushes is thus in particular avoided; the grouping of a portion of each machine on the stator 11 (and, here, in the same main winding 13) is very economical; and the use of a reversible machine is also very advantageous, while allowing to combine the de-icing with the taxiing via the second electric machine.

Here is how independent operation of the two electric machines is obtained. The first electric machine has conventional operation and its operation is based on the electromagnetic interaction between the main winding 13 and the magnetic poles 14 which are concentric to it. The electric energy passes through the main circuit 23. The second electric machine operates by induction of the receiver winding 15 via a homopolar magnetic flux produced by the main winding 13. The homopolar flux is in the shape of a loop passing through the magnetic bridge 16, the propeller-carrying shaft 3, the inner rotor 10 and the stator 11, and thus through the receiver winding 15. The receiver winding 15, since it is away from the main flux, is thus excited only when this homopolar component is imposed on the main winding 13, independently of the operation as a motor or generator of the first electric machine. The current provided to the heating device 27 can be alternating, or made continuous by a rectifier. Finally, the speed of rotation (or the rest) of the propeller-carrying shaft 3 does not have any effect.

The homopolar flux component can be created by an independent generator of alternating current, connected between the negative pole of the primary power supply of the main converter 22 and the neutral point of the main winding 13, in order to superimpose on the main currents a high-frequency homopolar component, by establishing an imbalance in the phases of the exciter main winding 13, via a modification of the voltage of the neutral by the circuit 24, with a star configuration of the phases of the main winding 13. To provide this additional current, the auxiliary converter 25, or the main converter 22 itself, can be used, by using the high-frequency quenching frequency of the latter by making it so that the instantaneous currents of the windings 13 are voluntarily unbalanced, their non-zero sum thus forming a homopolar current; the auxiliary converter 25 would then be omitted.

The control of the two electric machines by two different electric circuits 23 and 24 guarantees the independence of their operation. For convenience, it will be said that the circuit "controls" the reversible machine even if it operates as a motor.

Another embodiment of the invention will be described by means of FIG. 3. The electric machine carries the reference 29. The propeller-carrying shaft 3 again comprises a receiver winding 30, and it is surrounded by a stator ring 31 and a rotor 32. The rotor 32 is provided with a ring of magnetic poles 33, like above; however, here it surrounds the stator ring 31, which thus extends between it and the propeller-carrying shaft 3. The stator ring 31 carries a main winding 34 and a concentric auxiliary winding 35, the main winding 34 being on the outside. Moreover, the receiver winding 30 is concentric to the auxiliary winding 35.

The auxiliary winding 35, three-phase, is controlled by an auxiliary converter 36 to which it is connected by an electric circuit 37 having three wires. The auxiliary converter 36 is moreover connected to the continuous bus 20 by filters 21, as was the case for the main converter 22 of the previous realisation. And the main winding 34 is controlled by a converter 38 and an electric circuit 39 that are analogous and independent.

The first electric machine of this device consists of the magnetic poles 33 of the rotor 32 and the main winding 34; this is a reversible machine, the operation of which is the same as the previous.

The second electric machine is composed of the auxiliary winding 35 which is an inductor, and the receiver winding 30 in which a current is induced by the former. The induction here does not necessarily use a homopolar component introducing a magnetic flux of a particular shape, but like above, the receiver winding 30 is assigned to the de-icing of the propeller 2 by a heating device.

Here, a mechanical transmission 43, the general description of which is identical to that of the mechanical transmission 40 already mentioned, also connects the rotor 32 to the casing 5 and allows them to exchange mechanical power in one direction or the other, by thus using the reversibility of the first electric machine.

The advantages of this embodiment are analogous to the previous one in terms of good integration of the combined electric machine into the casing 5, its compactness, its simplicity.

According to certain features:
the stator carries at least one winding 13, 34, 35 of the machine;
the winding 13 on the stator is connected to each of the electric circuits;
the second machine is disposed on the second rotor (the propeller-carrying shaft 3) either facing an end of the magnetic bridge adjacent to the second rotor or between said end and a portion of the second rotor that surrounds the stator;
the second electric machine is connected to a thermoelectric heating device.

What is claimed is:

1. Turboprop engine, comprising a propeller (2), a propeller-carrying shaft (3) and an electric machine (9, 29) around the propeller-carrying shaft, characterised in that the electric machine comprises a first machine formed of a stator (11, 31) and a first rotor (10, 32), and a second machine formed of the stator and a second rotor (3) corresponding to the propeller-carrying shaft, the stator, the first rotor and the second rotor being concentric, the first machine and the second machine being controlled by different circuits (23, 24, 37, 39), the first machine being reversible and the second electric machine belonging to a circuit for de-icing of the propeller, the second rotor (3) carrying an induced winding (15, 30), and the first rotor is connected to the second rotor by a mechanical transmission.

2. Turboprop engine according to claim 1, characterised in that the stator carries at least one winding (13, 34, 35), the first rotor carries magnetic poles (14, 33).

3. Turboprop engine according to claim 2, characterised in that the winding (13) on the stator is the only one and shared by the first and the second machine, and connected to each of the electric circuits.

4. Turboprop engine according to claim 3, characterised in that the winding is multi-phase, the electric circuit (23) of the first machine is connected to the phases of the winding (13) on the stator, and the electric circuit (24) of the second machine is connected to a neutral of said winding (13).

5. Turboprop engine according to claim 1, characterised in that it comprises a magnetic pole (16) between the stator (11) and the second rotor (3), the second machine being disposed on the second rotor either facing an end of the magnetic pole adjacent to the second rotor, or between said end and a portion of the second rotor that surrounds the stator.

6. Turboprop engine according to claim 1, characterised in that the first rotor (32) surrounds the stator (31), and the first machine and the second machine comprise concentric windings (34, 35) disposed on the stator.

7. Turboprop engine according to claim 6, characterised in that the winding (35) of the second machine disposed on the stator is concentric to an induced winding (30) of the second machine disposed on the second rotor.

8. Turboprop engine according to claim 1, characterised in that the second electric machine is connected to a thermoelectric heating device (27).

9. Aircraft, characterised in that it comprises a turboprop engine according to claim 1.

* * * * *